US012615777B2

(12) United States Patent　　　(10) Patent No.:　US 12,615,777 B2
Nakajima et al.　　　　　　　　　　(45) Date of Patent:　　Apr. 28, 2026

(54) SEMICONDUCTOR DEVICE WITH IMPROVED CHANNEL MOBILITY

(71) Applicant: Kioxia Corporation, Tokyo (JP)

(72) Inventors: Yusuke Nakajima, Yokohama (JP);
Akira Takashima, Tokyo (JP);
Tsunehiro Ino, Fujisawa (JP); Atsushi Murakoshi, Yokohama (JP); Masaki Noguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 457 days.

(21) Appl. No.: 18/177,055

(22) Filed: Mar. 1, 2023

(65) Prior Publication Data

US 2023/0413554 A1　　Dec. 21, 2023

(30) Foreign Application Priority Data

Jun. 21, 2022　　(JP) ................................. 2022-099535

(51) Int. Cl.
H10B 43/27　　　　(2023.01)
H10B 43/10　　　　(2023.01)

(52) U.S. Cl.
CPC ............. H10B 43/27 (2023.02); H10B 43/10 (2023.02)

(58) Field of Classification Search
CPC . H01L 27/1027; H01L 27/1028; H10B 53/00;
H10B 53/10; H10B 53/20; H10B 53/30;
H10B 53/40; H10B 53/50; H10B 41/00;
H10B 41/10; H10B 41/20; H10B 41/23;
H10B 41/27; H10B 41/30; H10B 41/35;
H10B 41/40–44; H10B 41/46–50; H10B 41/60; H10B 41/70; H10B 43/00; H10B
43/10; H10B 43/20; H10B 43/23; H10B
43/27; H10B 43/30; H10B 43/35; H10B
43/40; H10B 43/50; H10B 51/00; H10B
51/10; H10B 51/20; H10B 51/30; H10B
51/40; H10B 51/50
See application file for complete search history.

(56) References Cited

U.S. PATENT DOCUMENTS 8,674,430 B2　　3/2014　Yasuda
2010/0140684 A1*　6/2010　Ozawa .............. H01L 21/02255
257/E21.21

(Continued)

FOREIGN PATENT DOCUMENTS

JP　　　　2014187286 A　　10/2014

*Primary Examiner* — William B Partridge
*Assistant Examiner* — Gustavo G Ramallo
(74) *Attorney, Agent, or Firm* — Kim & Stewart LLP

(57) ABSTRACT

According to one embodiment, a semiconductor device includes a stacked body of alternating conductor layers and insulator layers stacked in a first direction and a columnar body extending through the stacked body in the first direction. The columnar body includes a first insulating layer extending in the first direction and comprising aluminum and oxygen, a semiconductor layer between the first insulating layer and the conductor layers of the stacked body, a charge storage film between the semiconductor layer and the conductor layers, and a second insulating layer between the semiconductor layer and the first insulating layer and comprising silicon and oxygen. An interface between the semiconductor layer and the second insulating layer contains nitrogen to eliminate defects which may reduce channel mobility or the like.

13 Claims, 15 Drawing Sheets

(56) References Cited

U.S. PATENT DOCUMENTS

| | | | | |
|---|---|---|---|---|
| 2014/0286098 A1 | 9/2014 | Yasuda | | |
| 2014/0367763 A1 | 12/2014 | Yasuda | | |
| 2016/0268295 A1* | 9/2016 | Kamigaichi | ........... | H10B 43/27 |
| 2017/0077125 A1* | 3/2017 | Yamasaki | .............. | H10B 43/35 |
| 2019/0319043 A1* | 10/2019 | Takashima | ........... | H10D 30/694 |
| 2021/0257500 A1 | 8/2021 | Noguchi | | |
| 2022/0077183 A1* | 3/2022 | Morita | ................... | H10B 43/27 |

* cited by examiner

21

SEMICONDUCTOR DEVICE WITH IMPROVED CHANNEL MOBILITY

CROSS-REFERENCE TO RELATED APPLICATION

This application is based upon and claims the benefit of priority from Japanese Patent Application No. 2022-099535, filed Jun. 21, 2022, the entire contents of which are incorporated herein by reference.

FIELD

Embodiments described herein relate generally to a semiconductor device and a method of manufacturing a semiconductor device.

BACKGROUND

In a semiconductor device, a semiconductor layer containing polysilicon can be provided between a core portion and a charge storage film of a memory pillar or the like.

DETAILED DESCRIPTION

Embodiments provide a semiconductor device having improved channel mobility and a method of manufacturing such a semiconductor device.

In general, according to one embodiment, a semiconductor device includes a stacked body of conductor layers and insulator layers alternately stacked in a first direction and a columnar body extending through the stacked body in the first direction. The columnar body includes a first insulating layer extending in the first direction and comprising aluminum and oxygen, a semiconductor layer between the first insulating layer and the conductor layers of the stacked body, a charge storage film between the semiconductor layer and the conductor layers, and a second insulating layer between the semiconductor layer and the first insulating layer and comprising silicon and oxygen. An interface between the semiconductor layer and the second insulating layer contains nitrogen.

Hereinafter, certain example embodiments will be described with reference to the drawings. In order to facilitate understanding, the same components or aspects in different drawing will, in general, be denoted by the same reference symbols, and redundant descriptions of such components and aspects may be omitted from description of subsequent drawings and/or embodiments related thereto.

First Embodiment (Configuration of Memory System)

Figure 1:
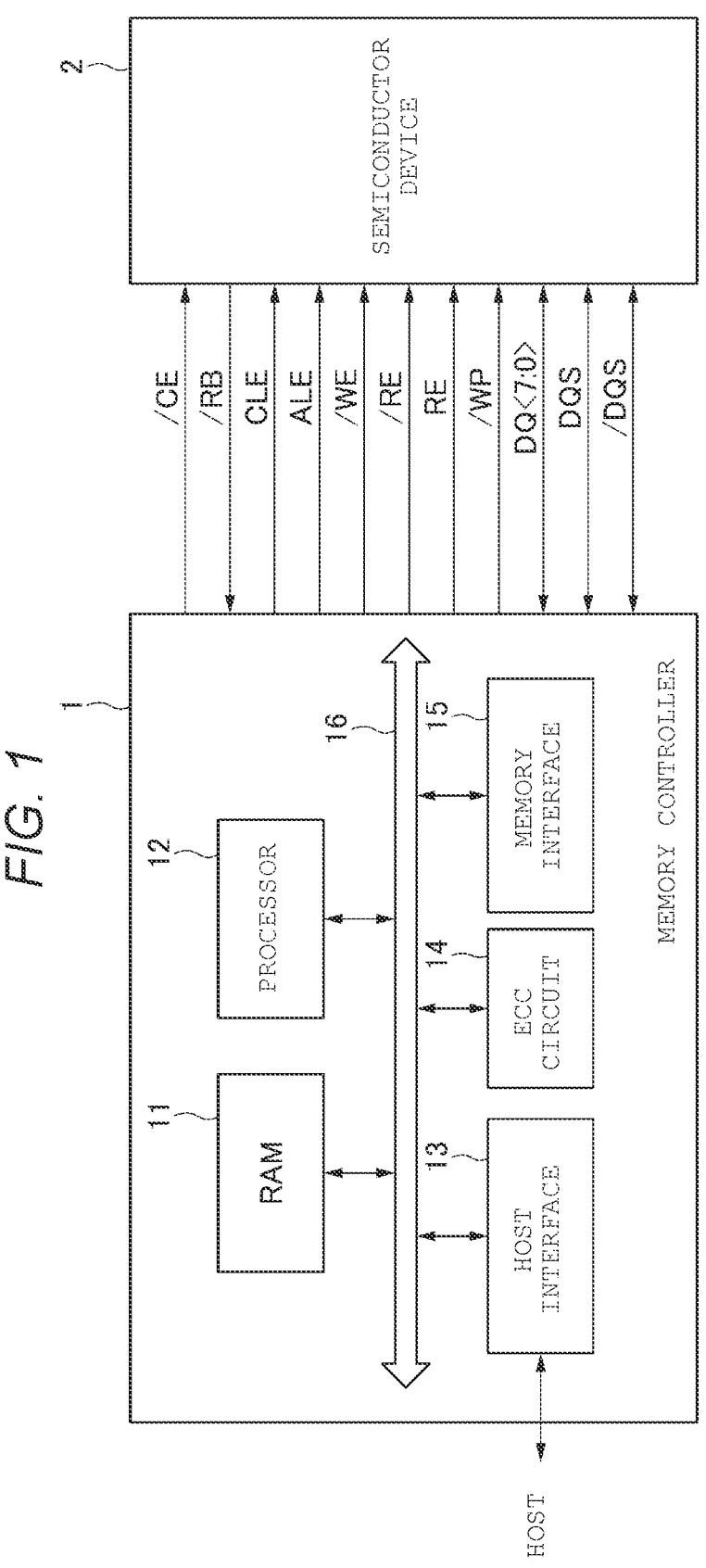
FIG. 1 is a block diagram of a memory system according to a first embodiment.

As shown in FIG. 1, a memory system of this first embodiment includes a memory controller 1 and a semiconductor device 2 (e.g., a semiconductor storage device). The semiconductor device 2 is a nonvolatile storage device configured as a NAND type flash memory. The memory system is connectable to a host. The host is, for example, an electronic device such as a personal computer or a mobile terminal. Although only one semiconductor device 2 is shown in FIG. 1, a plurality of semiconductor devices 2 can be provided in an actual memory system.

The memory controller 1 controls writing of data to the semiconductor device 2 according to a write request from the host. The memory controller 1 also controls reading of data from the semiconductor device 2 according to a read request from the host.

A chip enable signal /CE, a ready busy signal /RB, a command latch enable signal CLE, an address latch enable signal ALE, a write enable signal /WE, read enable signals RE and /RE, a write protect signal /WP, a data signal DQ<7:0>, and data strobe signals DQS and /DQS are transmitted and/or received between the memory controller 1 and the semiconductor device 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request and user data (write data) received from the host to the internal bus 16. The host interface 13 also transmits user data read from the semiconductor device 2, a response from the processor 12, and the like to the host.

The memory interface 15 controls a process of writing user data to the semiconductor device 2 and a process of reading user data from the semiconductor device 2 based on an instruction from the processor 12.

The processor 12 controls overall operations of the memory controller 1. The processor 12 is, for example, a CPU, an MPU, or the like. Upon receiving a request from the host via the host interface 13, the processor 12 performs a control operation according to the request.

The processor 12 determines a storage area (memory area) in the semiconductor device 2 for the user data stored in the RAM 11. The user data is stored in the RAM 11 via the internal bus 16. The processor 12 selects a memory area for a page unit of data (one page of data). The page unit is the size of a write unit (the increment size for data that is written in a data write operation). One page of user data that can be stored in the semiconductor device 2 is also referred to as "unit data" or "unit size data". Unit data is generally encoded and stored in the semiconductor device 2 as a codeword.

The processor 12 selects or otherwise determines which memory area of the semiconductor device 2 to set as a write destination for each piece of unit data. A physical address is allocated to each of the selectable memory areas of the semiconductor device 2. The processor 12 manages the memory areas using the physical addresses. The processor 12 instructs the memory interface 15 to write the user data to the semiconductor device 2 by designating the selected memory area (physical address). The processor 12 tracks the correspondence relationship between a logical address of user data (the logical address is managed/tracked by the host) and a physical address. When the processor 12 receives a read request including a logical address from the host, the processor 12 specifies a physical address corresponding to the logical address and instructs the memory interface 15 to read the user data from the designated physical address.

The ECC circuit 14 encodes the user data stored in the RAM 11 to generate a codeword. The ECC circuit 14 also decodes the codeword when read from the semiconductor device 2.

The RAM 11 temporarily stores user data received from the host until the user data can be stored in the semiconductor device 2, and also temporarily stores data read from the semiconductor device 2 until the data can be transmitted to the host. The RAM 11 is a general-purpose memory such as an SRAM or a DRAM in this example.

When a write request is received from the host, the memory system in FIG. 1 operates as follows. The processor 12 first temporarily stores data to be written to the semiconductor device 2 in the RAM 11. The processor 12 then reads the data that has been stored in the RAM 11 and sends the data from the RAM 11 to the ECC circuit 14. The ECC circuit 14 encodes the data and sends a codeword to the memory interface 15. The memory interface 15 writes the codeword to semiconductor device 2.

Upon receiving a read request from the host, the memory system in FIG. 1 operates as follows. The memory interface 15 sends the codeword read from the semiconductor device 2 to the ECC circuit 14. The ECC circuit 14 decodes the codeword and stores decoded data in RAM 11. The processor 12 then transmits the data from RAM 11 to the host via the host interface 13.

(Configuration of Semiconductor Device)

Figure 2:
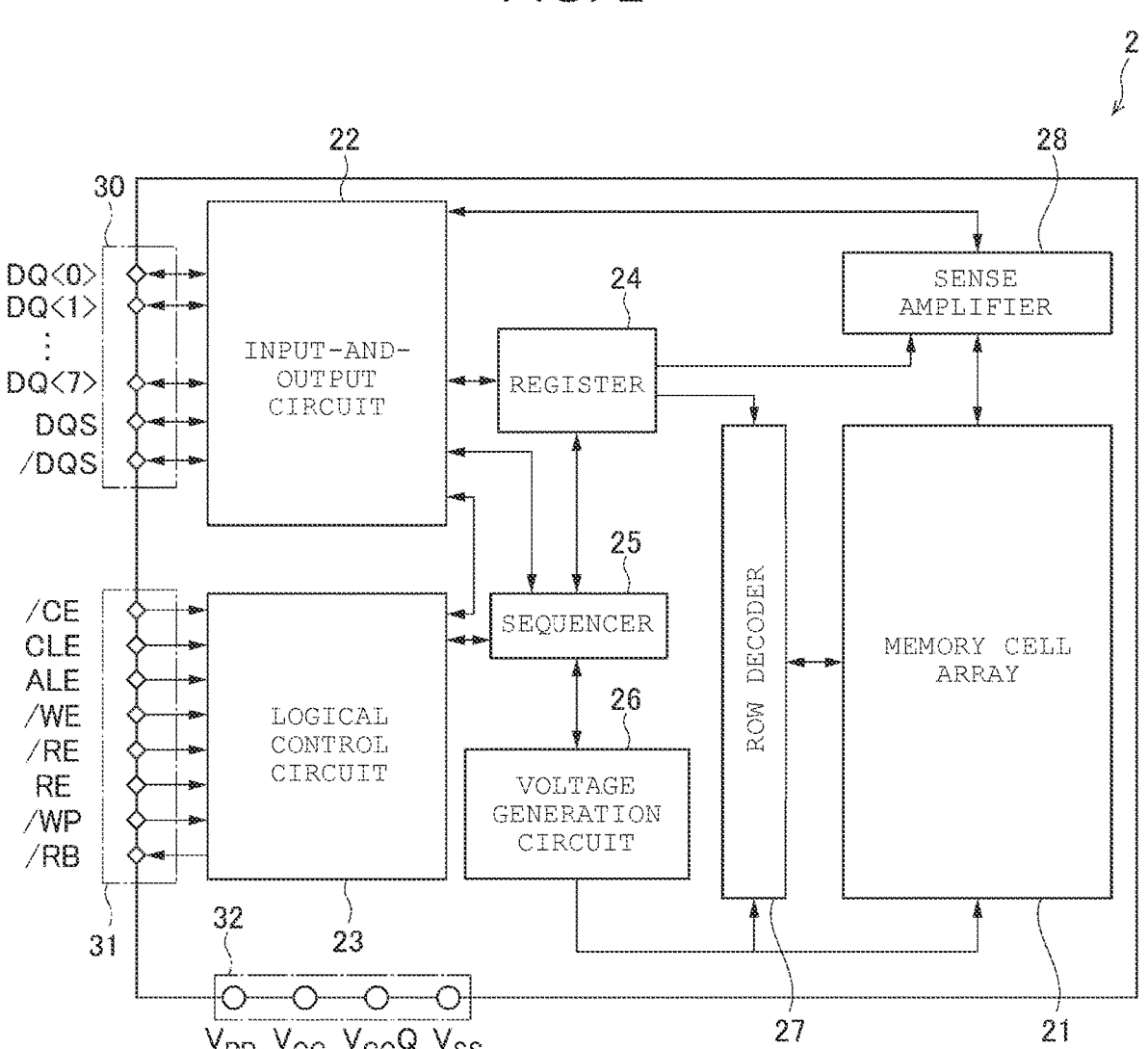
FIG. 2 is a block diagram of a semiconductor device according to a first embodiment.

As shown in FIG. 2, the semiconductor device 2 includes a memory cell array 21, an input-and-output circuit 22, a logical control circuit 23, a register 24, a sequencer 25, a voltage generation circuit 26, a row decoder 27, a sense amplifier 28, an input-and-output pad group 30, a logical control pad group 31, and a power input terminal group 32.

The memory cell array 21 is configured to store data. The memory cell array 21 includes a plurality of memory cell transistors associated with a plurality of bit lines and a plurality of word lines.

The input-and-output circuit 22 transmits and receives the signal DQ<7:0> (e.g., an 8-bit signal in this example) and the data strobe signals DQS and /DQS to and from the memory controller 1. The input-and-output circuit 22 also transfers a command and an address in the signal DQ<7:0> to the register 24. The input-and-output circuit 22 transmits and receives write data and read data to and from the sense amplifier 28.

The logical control circuit 23 receives the chip enable signal /CE, the command latch enable signal CLE, the address latch enable signal ALE, the write enable signal /WE, the read enable signals RE and /RE, and the write protect signal /WP from the memory controller 1. The logical control circuit 23 transfers the ready busy signal /RB to the memory controller 1 to indicate the state of the semiconductor device 2 to the outside.

The register 24 temporarily stores various data. For example, the register 24 stores commands that instruct a write operation, a read operation, an erasing operation, or the like. After these commands are input from the memory controller 1 to the input-and-output circuit 22, the commands are transferred from the input-and-output circuit 22 to the register 24 and stored therein. The register 24 also stores addresses associated with these commands. After these addresses are input from the memory controller 1 to the input-and-output circuit 22, the addresses are transferred from the input-and-output circuit 22 to the register 24 and stored therein. The register 24 also stores status information indicating the present operating state of the semiconductor device 2. The status information is updated by the sequencer 25 according to changes in the operating state of the memory cell array 21. The status information can be output (as a state signal) from the input-and-output circuit 22 to the memory controller 1 in response to a request from the memory controller 1.

The sequencer 25 controls the operation of the memory cell array 21 (and other units) based on a control signal sent from the memory controller 1 to the input-and-output circuit 22 and the logical control circuit 23.

The voltage generation circuit 26 is configured to generate voltages necessary for the write operation, the read operation, and the erasing operation. These voltages includes, for example, a voltage applied to word lines and bit lines of the memory cell array 21. The operation of the voltage generation circuit 26 is controlled by the sequencer 25.

The row decoder 27 is a circuit formed of a switch group configured to apply a voltage to each of the word lines of the memory cell array 21. The row decoder 27 receives a block address and a row address from the register 24, selects a block based on the block address, and selects a word line based on the row address. The row decoder 27 switches the open-and-close state of the switch group so that the voltage from the voltage generation circuit 26 is applied to the selected word line. The operation of the row decoder 27 is controlled by the sequencer 25.

The sense amplifier 28 is a circuit configured to adjust a voltage applied to the bit line of the memory cell array 21 and to read the voltage of the bit line to convert the read voltage into data. When reading data, the sense amplifier 28 acquires data read from the memory cell transistor of the memory cell array 21 to the bit line, and transmits the acquired data to the input-and-output circuit 22. When writing data, the sense amplifier 28 transmits data to be written to a memory cell transistor through the bit line. The operation of the sense amplifier 28 is controlled by the sequencer 25.

The input-and-output pad group 30 is provided with a plurality of terminals (pads) configured to transmit and receive signals between the memory controller 1 and the input-and-output circuit 22. The terminals can be individually provided corresponding to the signal DQ<7:0> and the data strobe signals DQS and /DQS.

The logical control pad group 31 is provided with a plurality of terminals configured to transmit and receive signals between the memory controller 1 and the logical control circuit 23. The terminals can be individually provided corresponding to the chip enable signal /CE, the command latch enable signal CLE, the address latch enable signal ALE, the write enable signal /WE, the read enable signals RE and /RE, the write protect signal /WP, and the ready busy signal /RB.

The power input terminal group 32 is provided with a plurality of terminals configured to receive voltages applied as necessary for the operation of the semiconductor device 2. The voltages applied to the respective terminals include power supply voltages Vcc, VccQ, Vpp and a ground voltage Vss. The power supply voltage Vcc is a circuit power supply voltage externally applied as an operating power supply, and for example, is a voltage of about 3.3 V. The power supply voltage VccQ is, for example, a voltage of 1.2 V. The power supply voltage VccQ is a voltage used when a signal is transmitted and received between the memory controller 1 and the semiconductor device 2. The power supply voltage Vpp is a power supply voltage higher than the power supply voltage Vcc, and for example, is a voltage of 12 V.

(Electronic Circuit Configuration of Memory Cell Array)

Figure 3:
FIG. 3 is a circuit diagram for a semiconductor device according to a first embodiment.

Next, the electronic circuit configuration of the memory cell array 21 will be described. As shown in FIG. 3, the memory cell array 21 includes a plurality of string units SU0 to SU3. Each of the string units SU0 to SU3 includes a plurality of NAND strings SR. Each NAND string SR includes, for example, eight memory cell transistors MT0 to MT7 and two select transistors STD and STS.

The plurality of string units SU0 to SU3 form one block as a whole. Although only a single block is shown in FIG. 3, the memory cell array 21 is actually provided with a plurality of such blocks.

Each of the string units SU0 to SU3 can also be referred to as a "string unit SU" without distinguishing between the string units SU0 to SU3. Each of the memory cell transistors MT0 to MT7 can also be referred to as a "memory cell transistor MT" without distinguishing between the memory cell transistors MT0 to MT7.

The memory cell array 21 includes N pieces of bit lines BL0 to BL(N−1). Here, "N" is a positive integer. Each string unit SU includes the same number of NAND strings SR as the number N of bit lines BL0 to BL(N−1). The memory cell transistors MT0 to MT7 provided in the NAND string SR are disposed in series between a source of the select transistor STD and a drain of the select transistor STS. A drain of the select transistor STD is connected to one of the bit lines BL0 to BL(N−1). A source of the select transistor STS is connected to a source line SL. In the following description, each of the bit lines BL0 to BL(N−1) can also be referred to as a "bit line BL" without distinguishing between the bit lines BL0 to BL(N−1).

Each memory cell transistor MT has a charge storage film in a gate portion. An amount of charge stored in the charge storage film corresponds to the data (data value) stored in the memory cell transistor MT.

Gates of the plurality of select transistors STD provided in the string unit SU0 are all connected to a select gate line SGD0. A voltage for switching between turning on/off of each select transistor STD is applied to the select gate line SGD0. The string units SU1 to SU3 are similarly connected to select gate lines SGD1 to SGD3, respectively. In the following description, each of the select gate lines SGD1 to SGD3 may be referred to as a "select gate line SGD" without distinguishing between the select gate lines SGD1 to SGD3.

Gates of the plurality of select transistors STS provided in the string unit SU0 are all connected to a select gate line SGS0. A voltage for switching between turning on/off of each select transistor STS is applied to the select gate line SGS0. The string units SU1 to SU3 are also similarly connected to select gate lines SGS1 to SGS3, respectively. In the following description, each of the select gate lines SGS1 to SGS3 may be referred to as a "select gate line SGS" without distinguishing between the select gate lines SGS1 to SGS3.

Gates of the memory cell transistors MT0 to MT7 are connected to word lines WL0 to WL7, respectively. A voltage can be applied to each of the word lines WL0 to WL7 for the purpose of switching conductive state of each of the memory cell transistors MT0 to MT7 or changing the amount of charges stored in each charge storage film of the respective memory cell transistor MT0 to MT7.

Writing and reading of data in the semiconductor device 2 is performed as a "page" corresponding to the plurality of memory cell transistors MT connected to of the same word lines WL in a string unit SU. On the other hand, erasing of data in the semiconductor device 2 is performed in as a block unit including all memory cell transistors MT provided in the same block. As a specific method of writing, reading, and erasing of data, various known methods can be adopted.

(Structure of Semiconductor Device)

Figure 4:
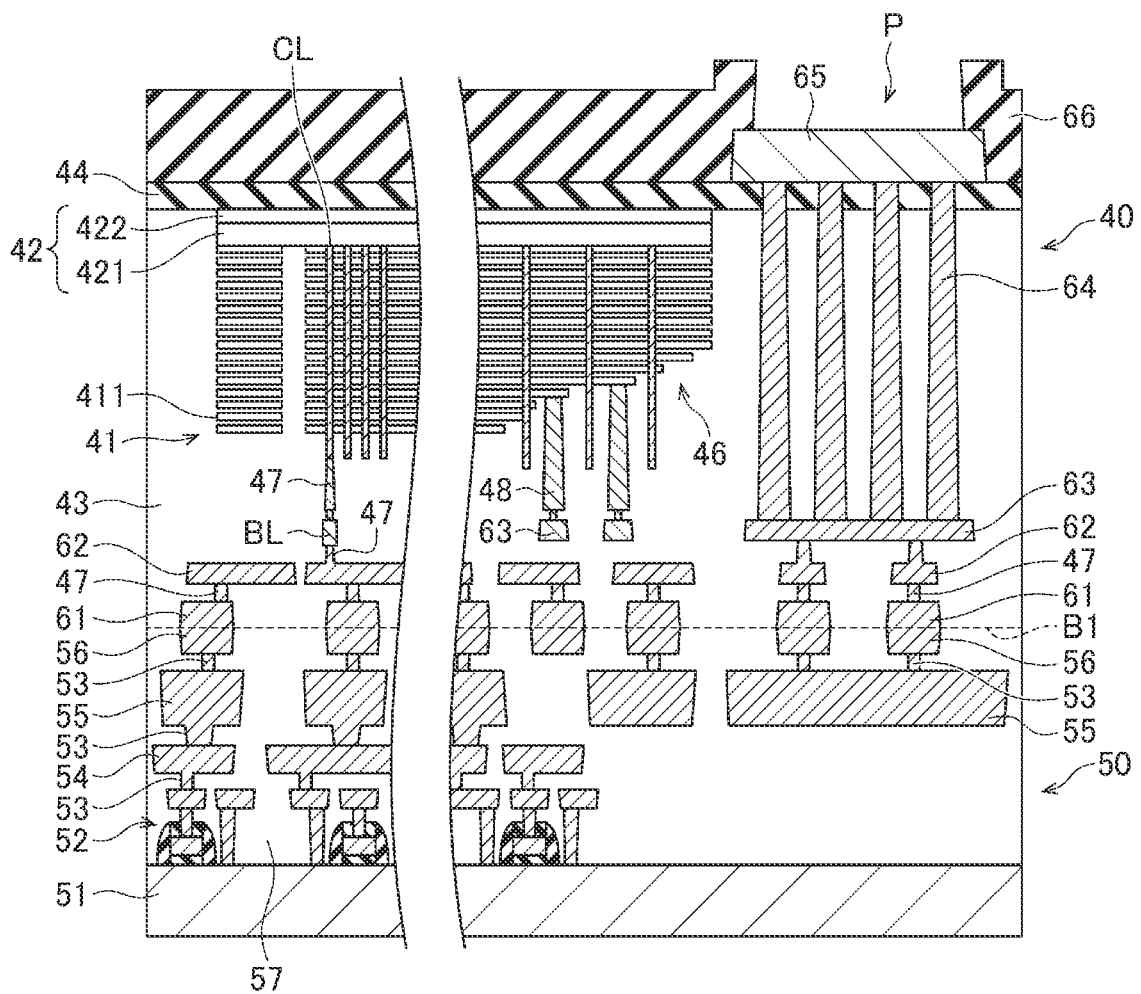
FIG. 4 is a cross-sectional view of a semiconductor device according to a first embodiment.

Next, the structure of the semiconductor device 2, particularly the structure near the memory cell array 21 will be specifically described. As shown in FIG. 4, the semiconductor device 2 includes a memory unit 40 including a stacked body 41 (comprising memory cell transistors) and a control circuit unit 50 (including a peripheral circuit). A peripheral circuit in this context includes a sense amplifier 28, a row decoder 27, and the like as shown in FIG. 2. The memory unit 40 and the control circuit unit 50 are bonded together at a bonding surface B1, and are electrically connected to each other via wiring bonded at the bonding surface B1. The semiconductor device 2 of this first embodiment has a CMOS Bonding Array (CBA) structure. In this first embodiment, the memory unit 40 corresponds to a first substrate and the control circuit unit 50 corresponds to a second substrate.

The control circuit unit 50 includes a substrate 51, a CMOS circuit 52, a via 53, wiring layers 54 to 56, and an interlayer insulating film 57.

The substrate 51 is, for example, a semiconductor substrate such as a silicon substrate. The CMOS circuit 52 is formed of transistors and the like provided on the substrate 51. Semiconductor elements such as a resistance element (resistor) and a capacitive element (capacitor) may also be formed on the substrate 51.

Hereinafter, certain directions parallel to the surface of the substrate 51 and orthogonal to each other are referred to as an X-direction and a Y-direction, and a direction perpendicular to the surface of the substrate 51 is referred to as a Z-direction. The +Z-direction is also referred to as an upwards direction or the like, and the −Z-direction is also referred to as downwards direction or the like. The −Z-direction may or may not match the direction of gravity.

A via 53 electrically connects the CMOS circuit 52 to the wiring layer 54, the wiring layer 54 to the wiring layer 55, or the wiring layer 55 to the wiring layer 56. The wiring layers 54 and 55 form a multilayer wiring structure in the interlayer insulating film 57. The wiring layer 56 is embedded in the interlayer insulating film 57 and is exposed on the surface of the interlayer insulating film 57. Here, the wiring layer 56 is substantially flush with the upper surface of the interlayer insulating film 57. The wiring layers 54 to 56 are electrically connected to the CMOS circuit 52 (or other elements) through a via 53. The vias 53 and the wiring layers 54 to 56 are formed of low resistance metal such as copper or tungsten. The interlayer insulating film 57 covers and protects the CMOS circuit 52, the vias 53, and the wiring layers 54 to 56. The interlayer insulating film 57 is, for example, a silicon oxide (SiOx) film.

The memory unit 40 includes stacked body 41, a columnar body CL, a source layer 42, an interlayer insulating film 43, and an insulating film 44.

The stacked body 41 is provided above the CMOS circuit 52 of the control circuit unit 50 and positioned in the Z-direction with respect to the substrate 51. The stacked body 41 is formed by alternately stacking a plurality of conductor layers 411 and a plurality of insulator layers in the Z-direction. One or more of conductor layers 411 at the upper and lower ends of the stacked body 41 in the Z-direction function as the select gate line SGS on the source side and the select gate line SGD on the drain side. The select gate line SGS on the source side is provided in an upper region of the stacked body 41, and the select gate line SGD on the drain side is provided in a lower region of the stacked body 41. The conductor layers 411 disposed between the select gate line SGS and the select gate line SGD function as the word lines WL. The bit lines BL are disposed below the stacked body 41. The bit lines BL extend in the Y-direction.

A staircase structure unit 46 is formed at an end portion of the stacked body 41 in the X-direction. The word lines WL are electrically connected to a wiring layer 63 via a contact 48.

The source layer 42 is provided above the stacked body 41 via an insulating film. The source layer 42 includes a lower layer 421 and an upper layer 422. The lower layer 421 functions as the source line SL shown in FIG. 3. The lower layer 421 is formed of a semiconductor material such as silicon. The upper layer 422 is formed of a metallic material such as tungsten.

The columnar body CL penetrates the stacked body 41 in the Z-direction. The lower end portion of the columnar body CL is electrically connected to a bit line BL by a via 47. The upper end portion of the columnar body CL is electrically connected to the source layer 42.

The via 47 and wiring layers 61, 62, 63 are provided below the stacked body 41. The wiring layers 61 to 63 form a multilayer wiring structure in the interlayer insulating film 43. Each bit line BL is provided in the wiring layer 63. The wiring layer 61 is embedded in the interlayer insulating film 43 and exposed on the surface of the interlayer insulating film 43. Here, the wiring layer 61 is almost flush with the surface of the interlayer insulating film 43. The wiring layers 61 to 63 are electrically connected to columnar bodies CL by the vias 47. The vias 47 and the wiring layers 61 to 63 are formed of low resistance metal such as copper or tungsten.

The insulating film 44 is provided above the stacked body 41. The insulating film 44 is, for example, a silicon oxide film or a silicon nitride (SiN) film.

A via 64 is provided at a position in the memory unit 40 shifted in the X-direction from the stacked body 41. The via 64 extends upwards from the wiring layer 63. A metal pad 65 is provided on the upper surface of the insulating film 44. An upper end portion of the via 64 penetrates the insulating film 44 to be electrically connected to the metal pad 65. The metal pad 65 is a metal film containing, for example, copper. The metal pad 65 functions as an external connection pad of semiconductor device 2. A passivation film 66 can be further provided on the upper surface of the insulating film 44 so as to leave the metal pad 65 (or a portion thereof) exposed. The passivation film 66 is, for example, a silicon oxide film. The passivation film 66 has an opening P to expose the upper surface of the metal pad 65. The metal pad 65 can be connected to a mounting substrate or other devices using a bonding wire or the like inserted via the opening P.

In the semiconductor device 2, the interlayer insulating film 43 of the memory unit 40 and the interlayer insulating film 57 of the control circuit unit 50 are bonded to each other on the bonding surface B1, and the wiring layer 61 of the memory unit 40 and the wiring layer 56 of the control circuit unit 50 are bonded to each other on the bonding surface B1. Accordingly, the memory unit 40 and the control circuit unit 50 are electrically connected to each other via the wiring layers 61 and 56.

(Structure of Stacked Body)

Figure 5:
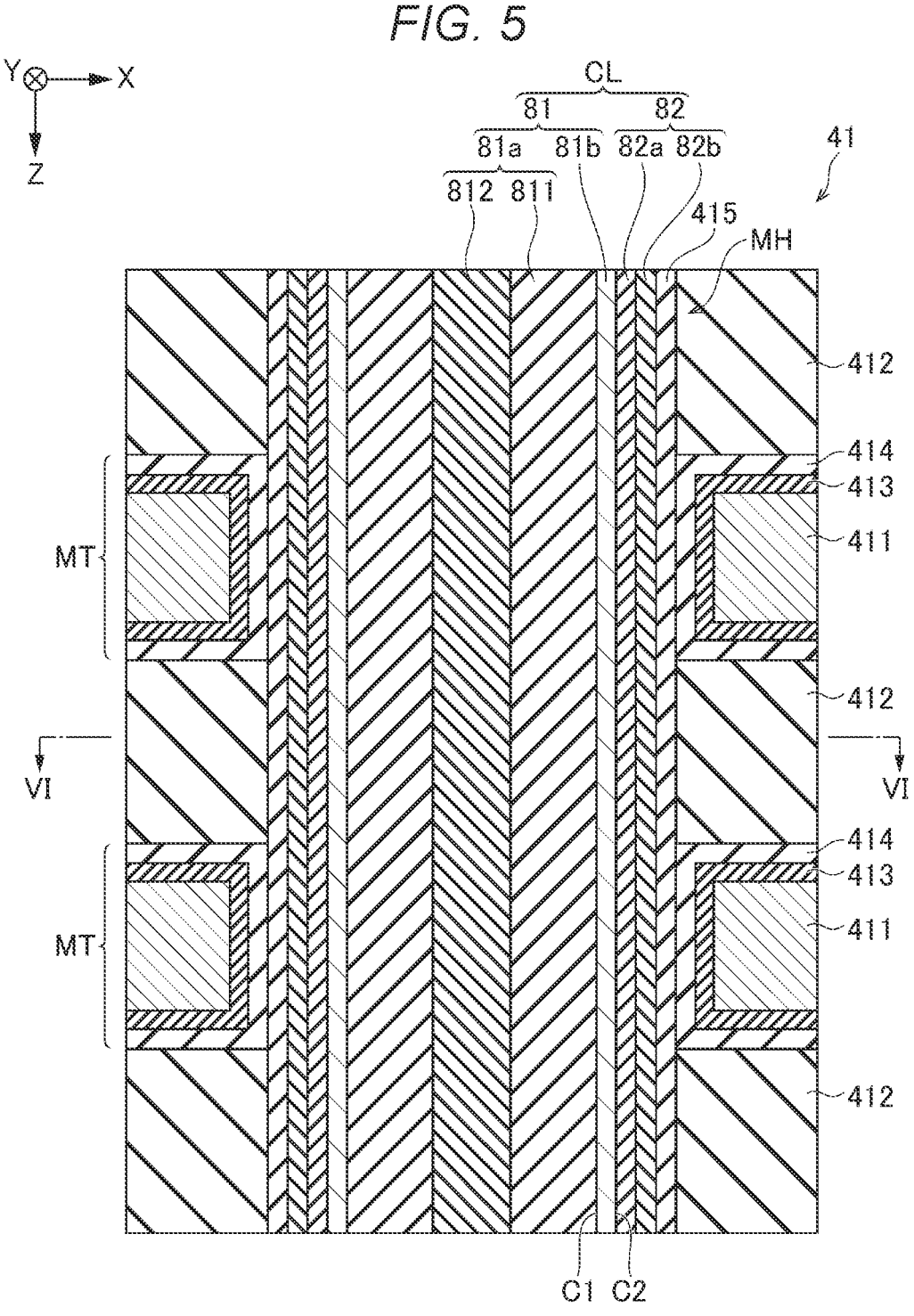
FIG. 5 is a cross-sectional view of a columnar body according to a first embodiment.
Figure 6:
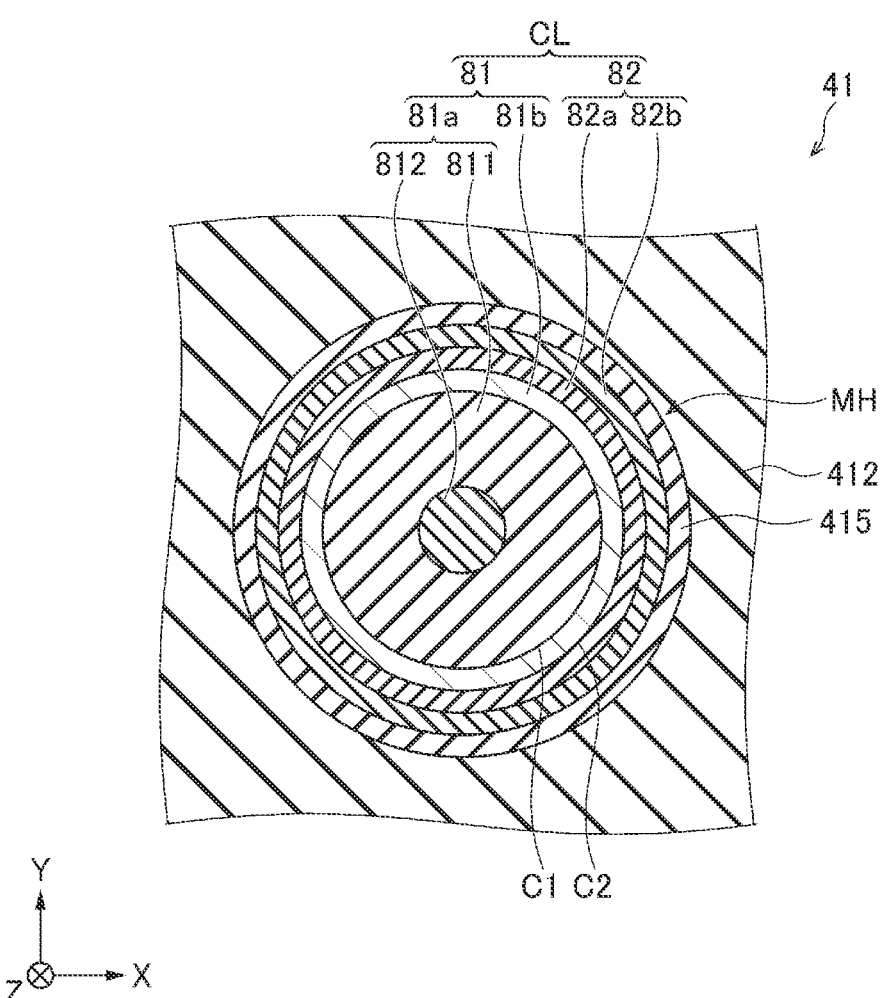
FIG. 6 is a cross-sectional view taken along line VI-VI of FIG. 5.

FIG. 5 shows a cross-sectional structure of the stacked body 41 when the columnar body CL is cut on the plane (X-Z plane) passing through the central axis thereof. FIG. 6 shows a cross-sectional structure taken along line VI-VI in FIG. 5.

As shown in FIG. 5, the stacked body 41 has a structure in which a plurality of conductor layers 411 and a plurality of insulator layers 412 are alternately stacked in the Z-direction.

The conductor layer 411 is a layer having electrical conductivity. The conductor layer 411 is formed of a metal material such as tungsten. A conductor layer 411 is used for each of the word lines WL0 to WL7, the select gate lines SGS and SGD, and the like depicted in FIG. 3.

An insulator layer 412 is disposed between the conductor layers 411 adjacent to each other in the Z-direction, and electrically insulates between the adjacent conductor layers 411. The insulator layers 412 are formed of, for example, silicon oxide.

A plurality of memory holes MH are formed in the stacked body 41 so as to extend in the Z-direction. A columnar body CL depicted in FIG. 4 is provided in each memory hole MH. Each columnar body CL corresponds to a NAND string SR depicted in FIG. 3.

As shown in FIG. 6, the columnar body CL has a circular or elliptical cross-sectional shape. The columnar body CL includes a semiconductor body 81 and a stacked film 82.

The semiconductor body 81 has a core portion 81a and a semiconductor layer 81b.

The semiconductor layer 81b is formed of, for example, polysilicon (Poly-Si). The semiconductor layer 81b forms a channel of the memory cell transistors MT.

The core portion 81a is provided in the semiconductor layer 81b. The core portion 81a includes a first core layer 812 (a first insulating layer) and a second core layer 811 (a second insulating layer). The second core layer 811 is provided on the inner periphery of the semiconductor layer 81b. The second core layer 811 is formed of, for example, silicon oxide. The first core layer 812 is provided on the inner periphery of the second core layer 811. The first core layer 812 is formed of, for example, aluminum oxide ($Al_2O_3$).

The stacked film 82 is a multi-layered film covering the outer periphery of the semiconductor body 81. The stacked film 82 includes, for example, a tunnel insulating film 82a and a charge storage film 82b. In this embodiment, the tunnel insulating film 82a corresponds to a fourth insulating layer.

The tunnel insulating film 82a is provided on the outer periphery of the semiconductor body 81. The tunnel insulating film 82a is, for example, a silicon oxide film or a film containing silicon oxide and silicon nitride. The tunnel insulating film 82a functions as a voltage barrier between the semiconductor layer 81b and the charge storage film 82b. For example, when electrons are injected from the semiconductor layer 81b into the charge storage film 82b (e.g., during write operation), the electrons pass through (tunnels through) the voltage barrier of the tunnel insulating film 82a. Furthermore, when a hole is injected from the semiconductor layer 81b into the charge storage film 82b (e.g., during erasing operation), the hole passes through the voltage barrier of the tunnel insulating film 82a.

The charge storage film 82b covers the outside of the tunnel insulating film 82a. The charge storage film 82b is, for example, a silicon nitride film. The charge storage film 82b has a trap site configured to trap charges in the film. A portion of the charge storage film 82b interposed between the conductor layer 411 and the semiconductor body 81 store charges which correspond to data values or the like. The charge storage film 82b (or a portion thereof) functions as a storage area of a memory cell transistor MT. A threshold voltage of the memory cell transistor MT varies depending on charges (or charge amount) stored in the charge storage film 82b.

As shown in FIGS. 5 and 6, the memory cell transistor MT of this first embodiment is a metal-oxide-nitride-oxide-silicon (MONOS) type using an insulating layer in the charge storage film 82b. The outer peripheral surface of the conductor layer 411 is covered with a barrier insulating film 413 and a block insulating film 414. The barrier insulating film 413 is a film configured to improve adhesion between the conductor layer 411 and the block insulating film 414.

As the barrier insulating film 413, when the conductor layer 411 is formed of tungsten, a stacked film including silicon nitride and titanium can be selected, for example. A conductor film formed of titanium nitride or the like may be used instead of the barrier insulating film 413. The block insulating film 414 is intended to prevent back tunneling of charges from the conductor layer 411 to the stacked film 82. The block insulating film 414 is, for example, a silicon oxide film or a metal oxide film. The metal oxide is, for example, aluminum oxide.

A cover insulating film 415 is provided between the insulator layer 412 and the charge storage film 82b. The cover insulating film 415 is, for example, a silicon oxide film. The cover insulating film 415 provided to protect the charge storage film 82b from being etched during a replacement process for replacing a sacrificial layer present during an initial manufacturing stage with the conductor layer 411 when the semiconductor device 2 is being manufactured. In this embodiment, the cover insulating film 415 corresponds to a fifth insulating layer. The cover insulating film 415 also functions as a part of the block insulating film.

A portion of the columnar body CL located at a position adjacent to each conductor layer 411 functions as a transistor. That is, in the columnar body CL, a plurality of transistors are electrically connected in series along the longitudinal direction thereof. Each conductor layer 411 functions as a gate of these transistors. The semiconductor layer 81b functions as a channel of each transistor.

Some of the transistors along the longitudinal direction of the columnar body CL function as the memory cell transistors MT shown in FIG. 3. The transistors formed near the upper and lower ends of the columnar body CL function as the select transistors STD and STS depicted in FIG. 3.

In the stacked body 41 having such a structure, a dangling bond of a silicon atom may be left at an interface C1 between the semiconductor layer 81b and the second core layer 811. This dangling bond may cause defects at the interface C1. This is one factor that causes deterioration in mobility of the channel of the memory cell transistors MT. In this embodiment, the interface C1 contains nitrogen (N). In other words, nitrogen is present at the interface C1 between the semiconductor layer 81b and the second core layer 811 and this serves to terminate/eliminate the dangling bond of the silicon atom, which functions to eliminate or avoid defects occurring at the interface C1. As a result, in the semiconductor device 2 of this embodiment, it is possible to improve the mobility in the channel of the memory cell transistor MT as compared with a semiconductor device in which nitrogen is not present at the interface C1.

(Method of Manufacturing Semiconductor Device)

Figure 7:
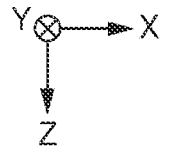
FIGS. 7 to 10 are cross-sectional views depicting aspects of a manufacturing process of a semiconductor device according to a first embodiment.
Figure 7:
Figure 7:
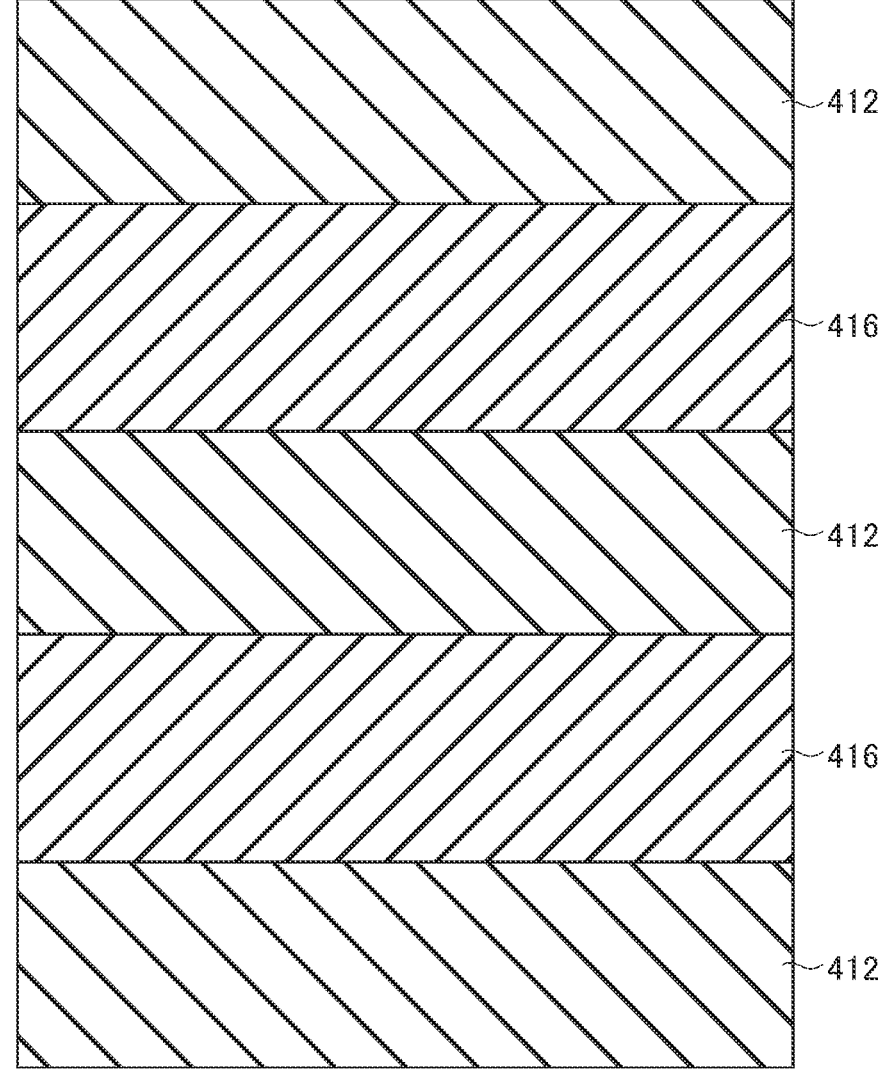
Figure 8:
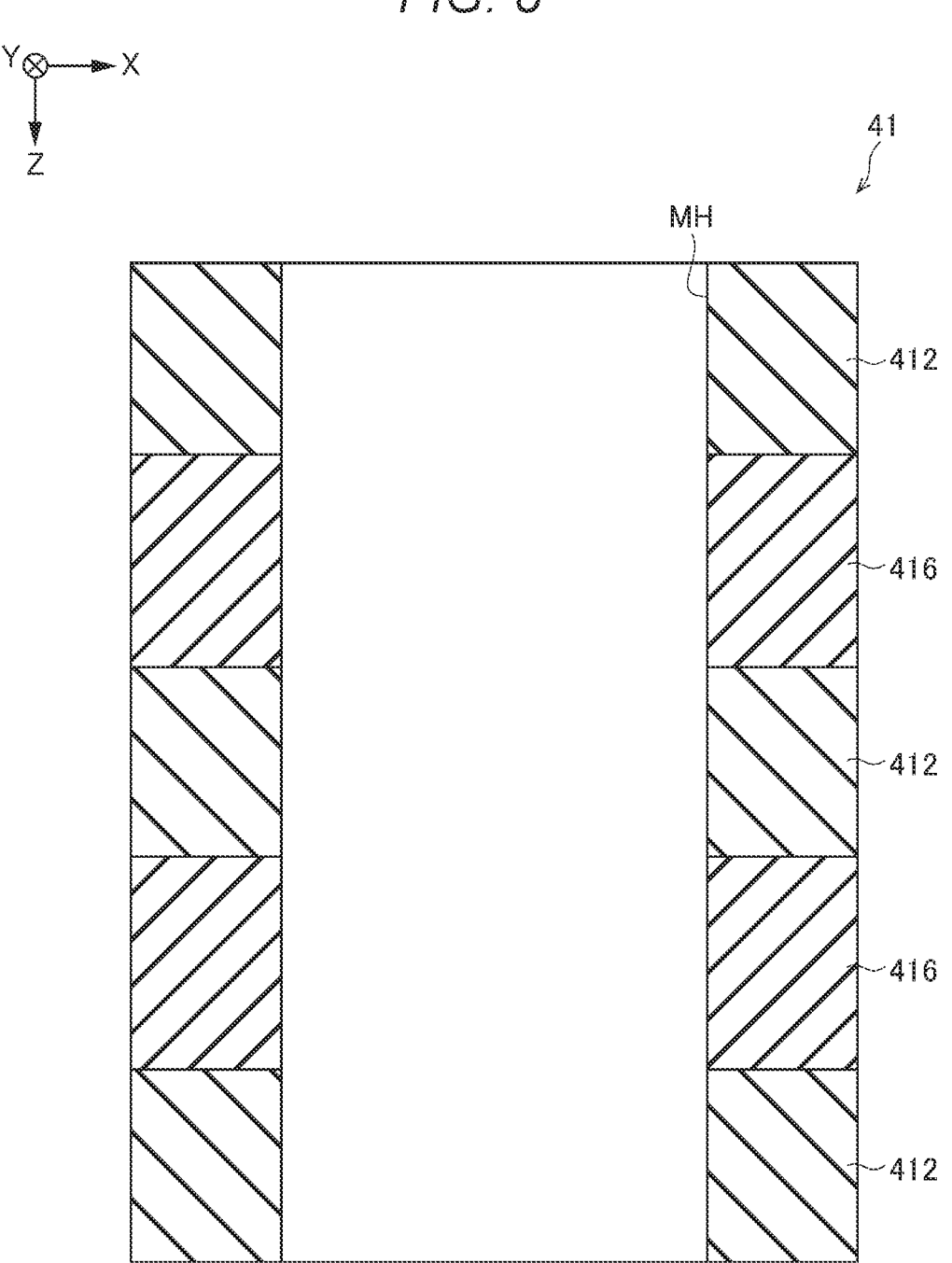
Figure 9:
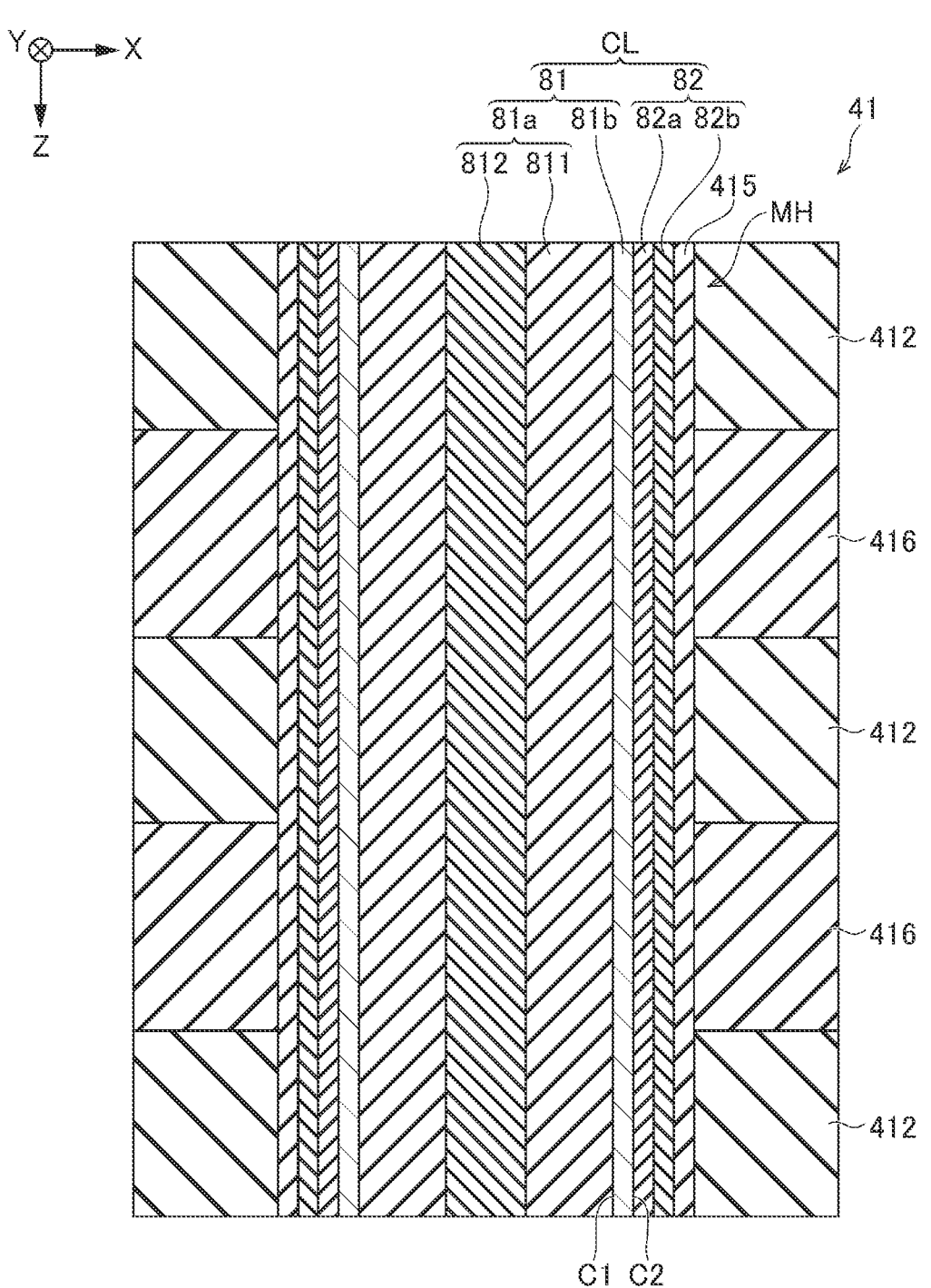

As shown in FIG. 7, the stacked body 41 is first formed by alternately stacking a plurality of insulator layers 412 and a plurality of sacrificial layers 416 on a substrate or the like. Thereafter, a memory hole MH is formed in the stacked body 41, as shown in FIG. 8. The sacrificial layer 416 is formed of, for example, silicon nitride. Subsequently, as shown in FIG. 9, the cover insulating film 415, the charge storage film 82b, the tunnel insulating film 82a, the semiconductor layer 81b, the second core layer 811, and the first core layer 812 are sequentially formed on the sidewalls of the memory hole MH. At this stage, the first core layer 812 is formed of aluminum nitride (AlN).

Next, in order to cause aluminum nitride contained in the first core layer 812 to transition to aluminum oxide ($Al_2O_3$), an annealing treatment is performed on the first core layer 812 of the stacked body 41 shown in FIG. 9 in the presence of oxygen gas. As the annealing treatment, it is possible to use rapid thermal annealing (RTA) treatment using only oxygen as a process gas, or annealing treatment in combination with another oxidation method such as annealing treatment in combination with in situ steam generation (ISSG) oxidation using oxygen with hydrogen. When aluminum nitride of the first core layer 812 transitions to aluminum oxide by the annealing treatment, nitrogen contained in the first core layer 812 reaches the interface C1 between the semiconductor layer 81b and the second core layer 811 through the second core layer 811. Accordingly, the dangling bonds of the silicon atoms at the interface C1 between the semiconductor layer 81b and the second core layer 811 are terminated by nitrogen.

In order to perform the transition of aluminum nitride of the first core layer 812 to aluminum oxide more reliably, it is desirable to perform the annealing treatment at a temperature of 950° C. or higher. For example, when the annealing treatment is performed at a temperature below 900° C., a part of the aluminum nitride contained in the first core layer 812 might not transition to aluminum oxide. In this case, since the amount of nitrogen supplied to the interface C1 between the semiconductor layer 81b and the second core layer 811 is reduced, interface defects between the semiconductor layer 81b and the second core layer 811 may not be sufficiently terminated. If the annealing treatment is performed at a temperature of 950° C. or higher, all or substantially most of the aluminum nitride contained in the first core layer 812 can transition to aluminum oxide, thereby making it possible to supply sufficient nitrogen to the interface C1. As a result, the interface defects between the semiconductor layer 81b and the second core layer 811 can be terminated more reliably. Since the semiconductor device 2 is manufactured through such steps, nitrogen may be present in each of the second core layer 811 and the first core layer 812 of the semiconductor device 2 as manufactured.

Figure 10:
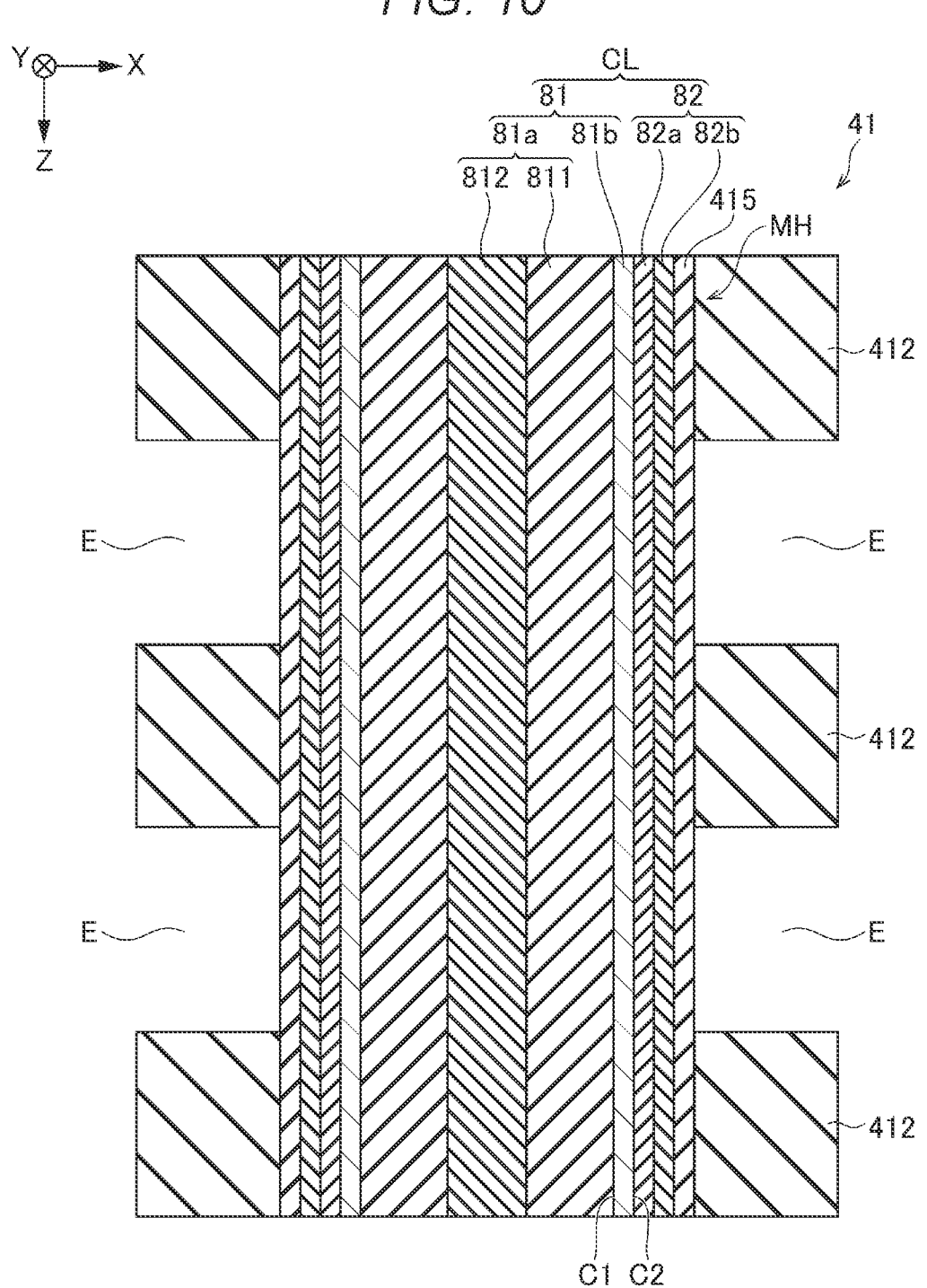

Next, after a groove or the like is formed in the stacked body 41 (in a region not depicted), the sacrificial layer 416 is removed by a chemical etchant such as phosphoric acid using this groove. Accordingly, a cavity E is formed between the adjacent insulator layers 412, as shown in FIG. 10. The surface of the insulator layer 412 in the Z-direction and the surface of the cover insulating film 415 are exposed in the cavity E. After that, the block insulating film 414, the barrier insulating film 413, and the conductor layer 411 are sequentially formed on the surface of the insulator layer 412 in the Z-direction and the surface of the cover insulating film 415, thereby completing formation of the stacked body 41 as shown in FIG. 5.

In some examples, the cover insulating film 415 exposed in the cavity E may be removed. In this case, after the surface of the charge storage film 82b is exposed, the block insulating film 414, the barrier insulating film 413, and the conductor layer 411 are sequentially formed on the surface of the insulator layer 412 in the Z-direction and the surface of the charge storage film 82b.

After that, when the manufacturing of the memory unit 40 having the stacked body 41 shown in FIG. 4 is completed, the memory unit 40 and the control circuit unit 50 are bonded to complete the manufacturing of the semiconductor device 2.

(Qualitative Analysis of Chemical Composition)

Figure 11:
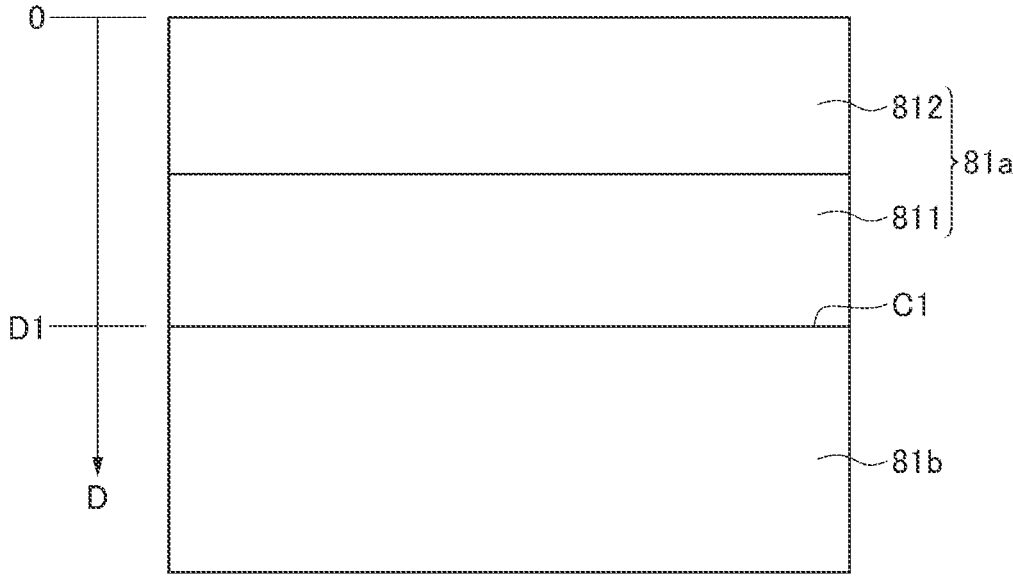
FIG. 11 depicts a sample according to a first embodiment.
Figure 12:
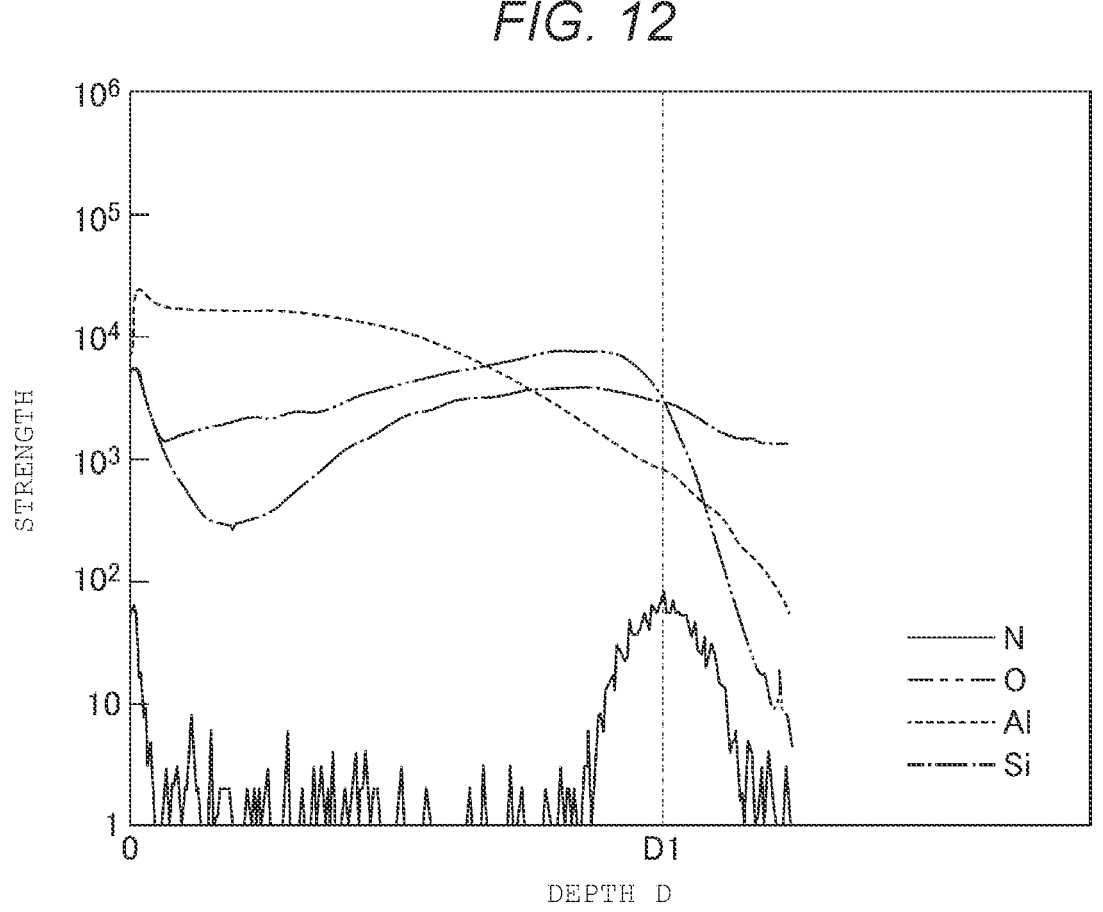
FIG. 12 is a graph depicting a relationship between a depth and a strength of an element in a sample.

After manufacturing a sample 100 having the semiconductor layer 81b, the second core layer 811, and the first core layer 812 as shown in FIG. 11 with the same method as the above-described manufacturing method, the element distribution of the sample 100 was analyzed. The graph in FIG. 12 shows analysis results for nitrogen (N), silicon (Si), oxygen (O), and aluminum (Al). The horizontal axis in FIG. 12 represents a depth D into the sample 100 shown in FIG. 11, and the vertical axis in FIG. 12 represents a strength (amount) of each element. The vertical axis in FIG. 12 is on a logarithmic scale. In addition, the analysis shown in FIG. 12 can be provided by, for example, secondary ion mass spectroscopy (SIMS).

As shown in FIG. 12, nitrogen is concentrated and mainly present at the depth D1 (see FIG. 11) inside sample 100. Depth D1 corresponds to the interface C1 between the semiconductor layer 81b and the second core layer 811. Therefore, similarly, nitrogen would expected to be concentrated and mainly present at the interface C1 between the semiconductor layer 81b and the second core layer 811 in the stacked body 41 of the semiconductor device 2 shown in FIG. 5. As noted, this nitrogen serves to terminate the interface defects between the semiconductor layer 81b and the second core layer 811.

(Effects)

The semiconductor device 2 includes the stacked body 41 formed by alternately stacking the conductor layers 411 and the insulator layers 412 in the Z-direction, and the columnar body CL penetrates the stacked body 41 in the Z-direction. The columnar body CL includes the semiconductor body 81 and the charge storage film 82b. The charge storage film 82b is disposed in a direction orthogonal to the Z-direction with respect to the semiconductor body 81, and is provided between the semiconductor body 81 and the conductor layers 411. The semiconductor body 81 includes the core portion 81a and the semiconductor layer 81b. The semiconductor layer 81b is disposed in a direction orthogonal to the Z-direction with respect to the core portion 81a, is provided between the core portion 81a and the charge storage film 82b, and contains polysilicon. The core portion 81a includes the first core layer 812 and the second core layer 811. The second core layer 811 is facing one surface of the semiconductor layer 81b, the one surface being opposite to the other surface of the semiconductor layer 81b facing the charge storage film 82b, and contains silicon oxide. The first core layer 812 is facing one surface of the second core layer 811, the one surface being opposite to the other surface of the second core layer 811 facing the semiconductor layer 81b, and contains aluminum oxide. Nitrogen is present at the interface C1 between the semiconductor layer 81b and the second core layer 811. Alternatively, the semiconductor layer 81b and the second core layer 811 may be said to contain nitrogen in those regions near the interface C1.

According to this configuration, nitrogen near the interface C1 between the semiconductor layer 81b and the second core layer 811 functions as an element for terminating defects in the interface C1. Therefore, it is possible to improve the mobility in the channel of the memory cell transistor MT.

In this embodiment, the memory unit 40 including the stacked body 41 of the memory cell transistors MT is formed, the control circuit unit 50 including a peripheral circuit is formed, and the semiconductor device 2 is manufactured by bonding the memory unit 40 and the control circuit unit 50 together.

According to this configuration, it is possible to prevent high-temperatures from being applied to the peripheral circuit of the control circuit unit 50 when the annealing treatment is performed on the memory unit 40. This avoids possible thermal damage or the like to the peripheral circuit which might otherwise occur.

(Modification)

In a semiconductor device 2 of a modification, nitrogen is presence not only at the interface C1 between the semiconductor layer 81b and the second core layer 811, but also at an interface C2 between the semiconductor layer 81b and the tunnel insulating film 82a. This nitrogen is supplied to the interface C2 when the annealing treatment is performed on the first core layer 812 in the manufacturing process of the semiconductor device 2. More specifically, when aluminum nitride of the first core layer 812 is converted to aluminum oxide by performing the annealing treatment on the first core layer 812 of the stacked body 41 as shown in FIG. 9, nitrogen from the first core layer 812 is supplied to the interface C1 through the second core layer 811, and some part of the nitrogen is further supplied to the interface C2 through the semiconductor layer 81b.

According to such a configuration, a dangling bond of silicon atoms present at the interface C2 between the semiconductor layer 81b and the tunnel insulating film 82a can be terminated with nitrogen. That is, nitrogen at the interface C2 functions as an element of terminating defects in the interface C2. Therefore, it is possible to further improve the mobility in the channel of the memory cell transistor MT.

Second Embodiment

Next, a semiconductor device 2 of a second embodiment and a method of manufacturing the same will be described. Description will focus on differences between the first embodiment and the second embodiment.

(Structure of Stacked Body)

Figure 13:
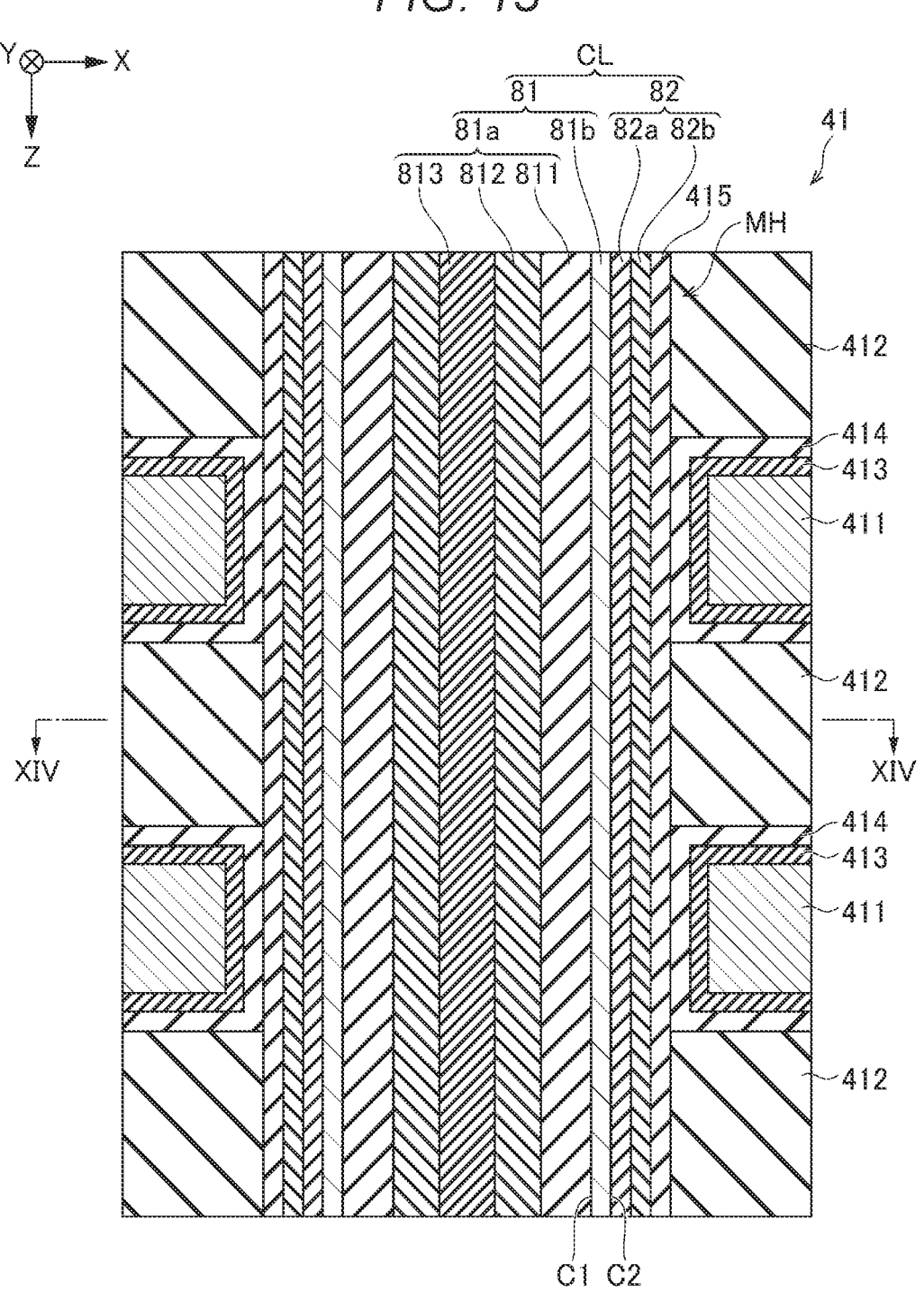
FIG. 13 is a cross-sectional view of a columnar body according to a second embodiment.
Figure 14:
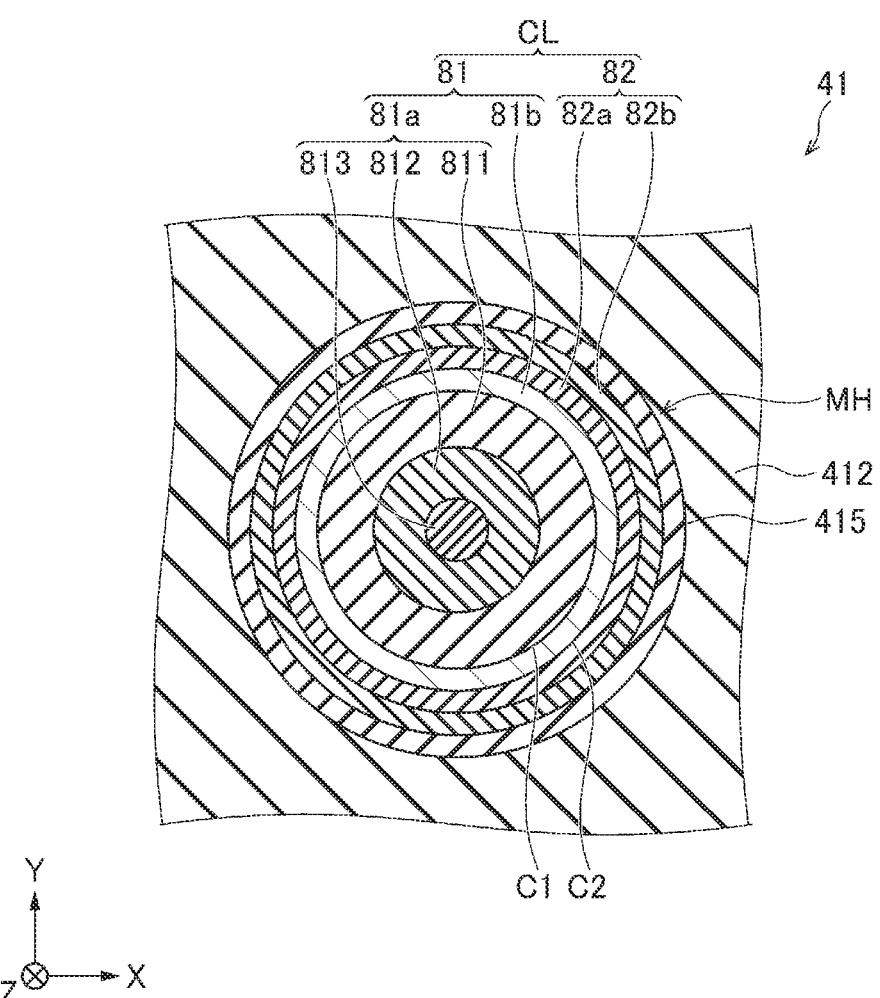
FIG. 14 is a cross-sectional view taken along line XIV-XIV of FIG. 13.

As shown in FIGS. 13 and 14, the core portion 81a of the stacked body 41 of the semiconductor device 2 of the second embodiment further includes a third core layer 813 as a third insulating layer. The third core layer 813 is provided on the inner periphery of the first core layer 812. The third core layer 813 is facing one surface of the first core layer 812, the one surface being opposite to the other surface of the first core layer 812 facing the second core layer 811. The third core layer 813 is formed of, for example, silicon oxide.

(Method of Manufacturing Semiconductor Device)

Figure 15:
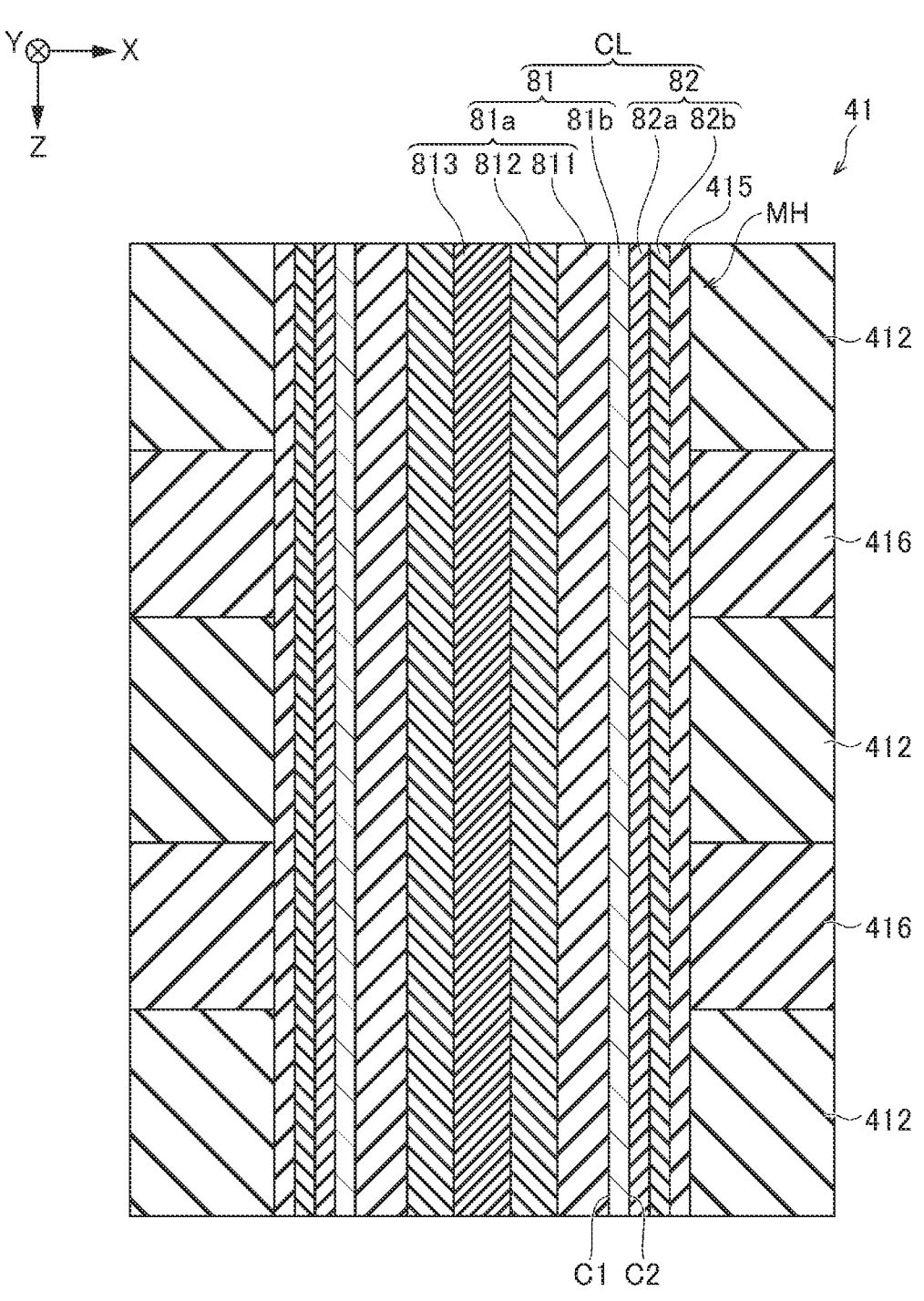
FIG. 15 is a cross-sectional view related to aspects of a manufacturing process of a semiconductor device according to a second embodiment.

After the memory hole MH is formed in the stacked body 41 as shown in FIG. 8, the cover insulating film 415, the charge storage film 82*b*, the tunnel insulating film 82*a*, the semiconductor layer 81*b*, the second core layer 811, the first core layer 812, and the third core layer 813 are sequentially formed on the respective inner surfaces of the insulator layers 412 and the sacrificial layers 416 in the memory hole MH, as shown in FIG. 15 for this second embodiment. The third core layer 813 is formed of, for example, silicon oxide. After this, the processes after the annealing treatment are performed in the same manner as in the first embodiment. The annealing treatment may be performed after the formation of the first core layer 812 but before the formation of the third core layer 813, and aluminum nitride contained in the first core layer 812 can efficiently convert to aluminum oxide.

(Effects)

According to the semiconductor device 2 of the second embodiment, it is possible to obtain the same or similar actions and effects as those of the first embodiment.

Other Embodiments

The present disclosure is not limited to the above specific examples.

For example, the memory cell transistor MT is not limited to the MONOS type but may be a floating gate (FG) type using a silicon film or the like in the charge storage film 82*b*.

In the semiconductor device 2 of the first embodiment, nitrogen may be contained in the second core layer 811, the first core layer 812, and the semiconductor layer 81*b*. In the semiconductor device 2 of the second embodiment, nitrogen may be further contained in the third core layer 813.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a stacked body including conductor layers and insulator layers alternately stacked in a first direction; and
a columnar body extending through the stacked body in the first direction, wherein
the columnar body includes:
a first insulating layer extending in the first direction, the first insulating layer comprising aluminum and oxygen,
a semiconductor layer extending in the first direction and between the first insulating layer and the conductor layers of the stacked body,
a charge storage film between the semiconductor layer and the conductor layers,
a second insulating layer extending in the first direction, the second insulating layer being between the semiconductor layer and the first insulating layer and comprising silicon and oxygen, and
a third insulating layer, the first insulating layer being between the third insulating layer and the second insulating layer, and
an interface between the semiconductor layer and the second insulating layer contains nitrogen.

2. The semiconductor device according to claim 1, wherein the third insulating layer comprises silicon and oxygen.

3. The semiconductor device according to claim 1, wherein
the first insulating layer surrounds the third insulating layer,
the second insulating layer surrounds the first insulating layer, and
the semiconductor layer surrounds the second insulating layer.

4. The semiconductor device according to claim 1, wherein the charge storage film comprises silicon and nitrogen.

5. The semiconductor device according to claim 4, wherein the columnar body further includes:
a fourth insulating layer between the charge storage film and the semiconductor layer, the fourth insulating layer comprising silicon and oxygen; and
a fifth insulating layer between the charge storage film and the conductor layers of the stacked body, the fifth insulating layer comprising silicon and oxygen.

6. The semiconductor device according to claim 5, wherein an interface between the fourth insulating layer and the semiconductor layer contains nitrogen.

7. The semiconductor device according to claim 1, wherein
the second insulating layer surrounds the first insulating layer, and
the semiconductor layer surrounds the second insulating layer.

8. The semiconductor device according to claim 1, wherein the semiconductor layer comprises silicon.

9. The semiconductor device according to claim 8, wherein the semiconductor layer is polysilicon.

10. A semiconductor memory device, comprising:
a stacked body of conductor layers and insulator layers alternately stacked in a first direction; and
a columnar body extending through the stacked body in the first direction, wherein
the columnar body includes:
a first insulating core layer extending in the first direction, the first insulating core layer comprising aluminum oxide,
a semiconductor film extending in the first direction, the semiconductor film being between the first insulating core layer and the conductor layers of the stacked body in a second direction perpendicular to the first direction,
a charge storage film between the semiconductor film and the conductor layers in the second direction,
a second insulating core layer extending in the first direction, the second insulating core layer being between the semiconductor layer and the first insulating core layer and comprising silicon oxide, and
a third insulating core layer comprising silicon oxide, the first insulating core layer being between the third insulating core layer and the second insulating core layer, and
nitrogen is present at an interface between the semiconductor layer and the second insulating core layer.

11. The semiconductor memory device according to claim 10, wherein the charge storage film comprises silicon nitride.

12. The semiconductor memory device according to claim 10, wherein the conductor layers of the stacked body comprise a metal, and the insulator layers of the stacked body comprise silicon oxide.

13. The semiconductor memory device according to claim 10, wherein the columnar body has a circular or elliptical cross-section.

* * * * *